United States Patent
Chao

(10) Patent No.: US 9,301,414 B2
(45) Date of Patent: Mar. 29, 2016

(54) WATERPROOF BOX STRUCTURE

(71) Applicant: GETAC TECHNOLOGY CORPORATION, Hsinchu County (TW)

(72) Inventor: Po-Tsun Chao, Taipei (TW)

(73) Assignee: Getac Technology Corporation, Hsinchu County (TW)

( * ) Notice: Subject to any disclaimer, the term of this patent is extended or adjusted under 35 U.S.C. 154(b) by 0 days.

(21) Appl. No.: 14/505,737

(22) Filed: Oct. 3, 2014

(65) Prior Publication Data

US 2015/0173228 A1 Jun. 18, 2015

Related U.S. Application Data

(60) Provisional application No. 61/917,273, filed on Dec. 17, 2013.

(30) Foreign Application Priority Data

Mar. 18, 2014 (CN) .......................... 2014 1 0099034

(51) Int. Cl.
| | |
|---|---|
| A45C 11/00 | (2006.01) |
| H05K 5/06 | (2006.01) |
| B29C 45/14 | (2006.01) |
| A45C 13/00 | (2006.01) |
| B29K 101/12 | (2006.01) |
| B29L 9/00 | (2006.01) |
| B29L 31/34 | (2006.01) |

(52) U.S. Cl.
CPC ................ *H05K 5/065* (2013.01); *A45C 11/00* (2013.01); *A45C 13/008* (2013.01); *B29C 45/14344* (2013.01); *A45C 2011/002* (2013.01); *B29C 45/14811* (2013.01); *B29C 2045/14459* (2013.01); *B29K 2101/12* (2013.01); *B29L 2009/00* (2013.01); *B29L 2031/3481* (2013.01)

(58) Field of Classification Search
CPC ................... A45C 2011/002; B29C 45/14344; B29K 2101/12; B29L 2009/00; B65D 25/14; B65D 81/02; H05K 5/065
USPC ............ 206/305, 320; 455/90.3, 575.1, 575.8
See application file for complete search history.

(56) References Cited

U.S. PATENT DOCUMENTS

| | | | | |
|---|---|---|---|---|
| 6,827,232 B1 * | 12/2004 | Hara | ..................... | H05K 5/0213 220/371 |
| 8,342,325 B2 * | 1/2013 | Rayner | ................. | G06F 1/1626 206/320 |
| 8,494,577 B2 * | 7/2013 | Shiogama | ............. | H04M 1/035 455/575.8 |
| 2013/0063004 A1 * | 3/2013 | Lai | ........................ | G06F 1/1688 312/223.1 |
| 2013/0146491 A1 * | 6/2013 | Ghali | .................... | G06F 1/1626 206/320 |
| 2013/0271902 A1 * | 10/2013 | Lai | ........................ | G06F 1/1656 361/679.01 |
| 2014/0183073 A1 * | 7/2014 | Pernu | ...................... | H05K 5/06 206/305 |

* cited by examiner

*Primary Examiner* — Bryon Gehman

(57) ABSTRACT

A waterproof box structure includes a composite plate and a soft film. The composite plate includes a chemical curing layer and a thermoplastic resin layer adhered and coupled to each other. The composite plate has a through hole. The through hole penetrates the chemical curing layer and the thermoplastic resin layer. The thermoplastic resin layer extends from the inner rim of the through hole and toward the center of the through hole to form a flange. The soft film hides the through hole. The outer rim of the soft film encloses the flange and is coupled to the flange.

17 Claims, 7 Drawing Sheets

WATERPROOF BOX STRUCTURE

BACKGROUND OF THE INVENTION

1. Field of the Invention

The present invention relates to waterproof boxes, and more particularly, to a waterproof box structure which is structurally simple and easy to produce and a waterproof box structure manufacturing method.

2. Description of the Prior Art

A conventional waterproof box is an accessory for use in protecting a mobile electronic device, as it encloses the mobile electronic device and thus shuts out ambient vapor and dust, thereby preventing ambient vapor and dust from intruding into the mobile electronic device.

In general, the conventional waterproof box comprises a tempered glass. The tempered glass corresponds in position to a display unit of the mobile electronic device to allow a user to watch the display unit through the tempered glass. The waterproof box further comprises at least a soft component. The soft component not only corresponds in position to the operational buttons on the mobile electronic device but also penetrates the waterproof box to connect with inner and outer surfaces of the waterproof box in a manner to allow the user to press the operational buttons. The tempered glass is usually made from a composite plate. To mount the soft component on the tempered glass, it is necessary for an external hard structure element to press against a junction between the soft component and the tempered glass and thereby ensure the water-tightness of the junction. As a result, the conventional waterproof box is structurally intricate and thus has an unsatisfactory processing yield.

In view of this, the inventor of the present invention studies the related prior art and the application of related theories in attempt to solve the aforesaid problems with a view to improving the related prior art.

SUMMARY OF THE INVENTION

It is an objective of the present invention to provide a waterproof box structure which is structurally simple and easy to produce and a waterproof box structure manufacturing method.

In order to achieve the above and other objectives, the present invention provides a waterproof box structure which comprises a composite plate and a soft film. The composite plate comprises a chemical curing layer and a thermoplastic resin layer adhered and coupled to each other. The composite plate has a through hole. The through hole penetrates the chemical curing layer and the thermoplastic resin layer. The thermoplastic resin layer extends from an inner rim of the through hole and toward the center of the through hole to form a flange. The soft film hides the through hole. An outer rim of the soft film encloses the flange and is coupled to the flange.

In order to achieve the above and other objectives, the present invention further provides a waterproof box structure manufacturing method, comprising the steps of: providing a composite plate, wherein the composite plate comprises a chemical curing layer and a thermoplastic resin layer adhered and coupled to each other; forming a through hole in the composite plate, wherein the through hole penetrates the chemical curing layer and the thermoplastic resin layer; removing the chemical curing layer from an inner rim of the through hole so as for the thermoplastic resin layer to extend from the inner rim of the through hole and toward a center of the through hole to form a flange; and forming a soft film for hiding the through hole such that an outer rim of the soft film encloses the flange and is coupled to the flange.

The chemical curing layer is removed from the inner rim of the through hole, such that the thermoplastic resin layer is exposed to form a flange to which the soft film is coupled. Hence, the waterproof box structure of the present invention is not only structurally simple, but is also easy to manufacture because it is molded with a mold.

DETAILED DESCRIPTION OF THE EMBODIMENTS

Figure 1:
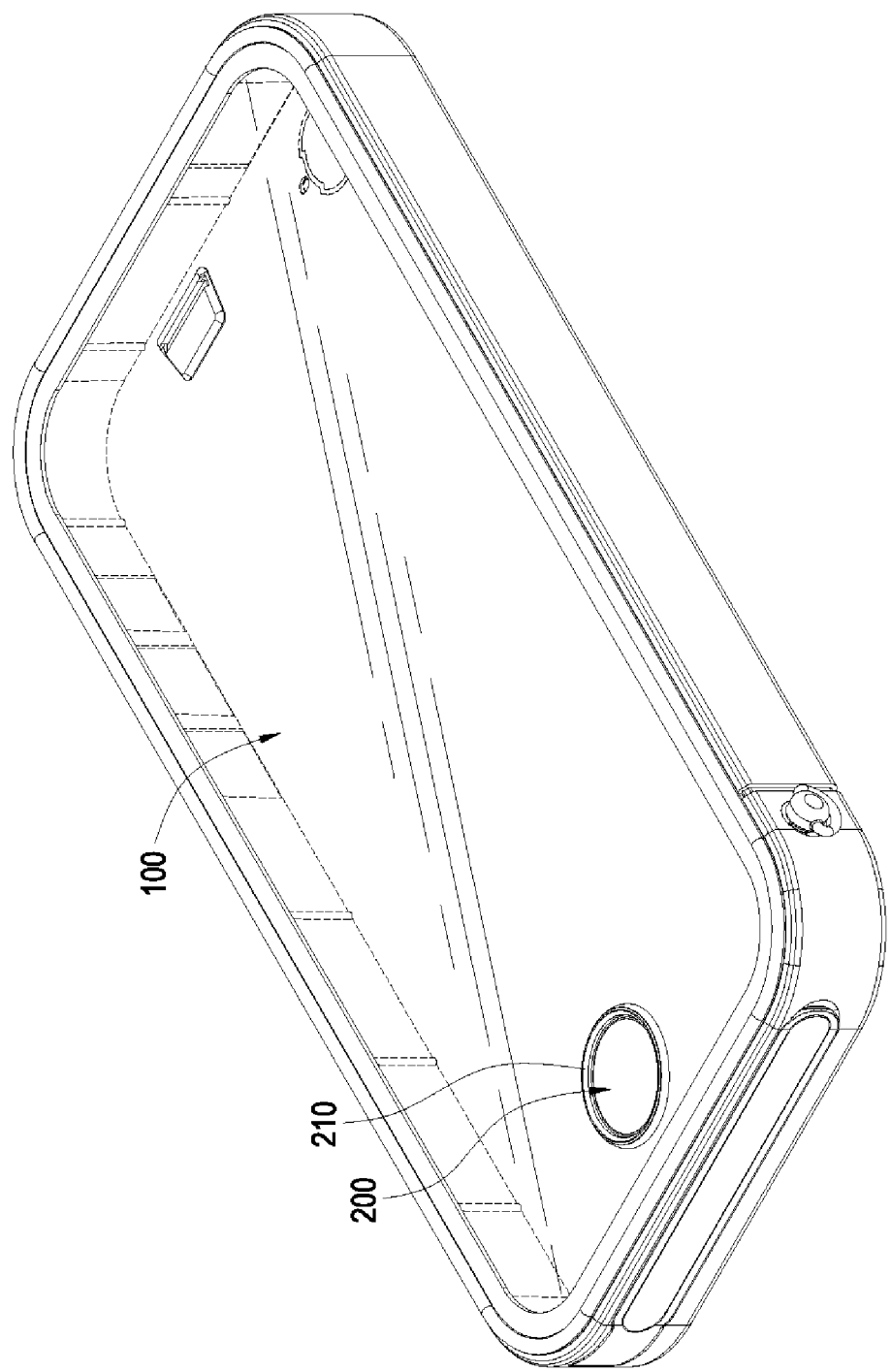
FIG. 1 is a schematic perspective view of a waterproof box structure of the present invention.

Referring to FIG. 1, there is shown a schematic perspective view of a waterproof box structure according to the first embodiment of the present invention. In the first embodiment of the present invention, a waterproof box structure comprises a composite plate 100 and a soft film 200.

Figure 2:
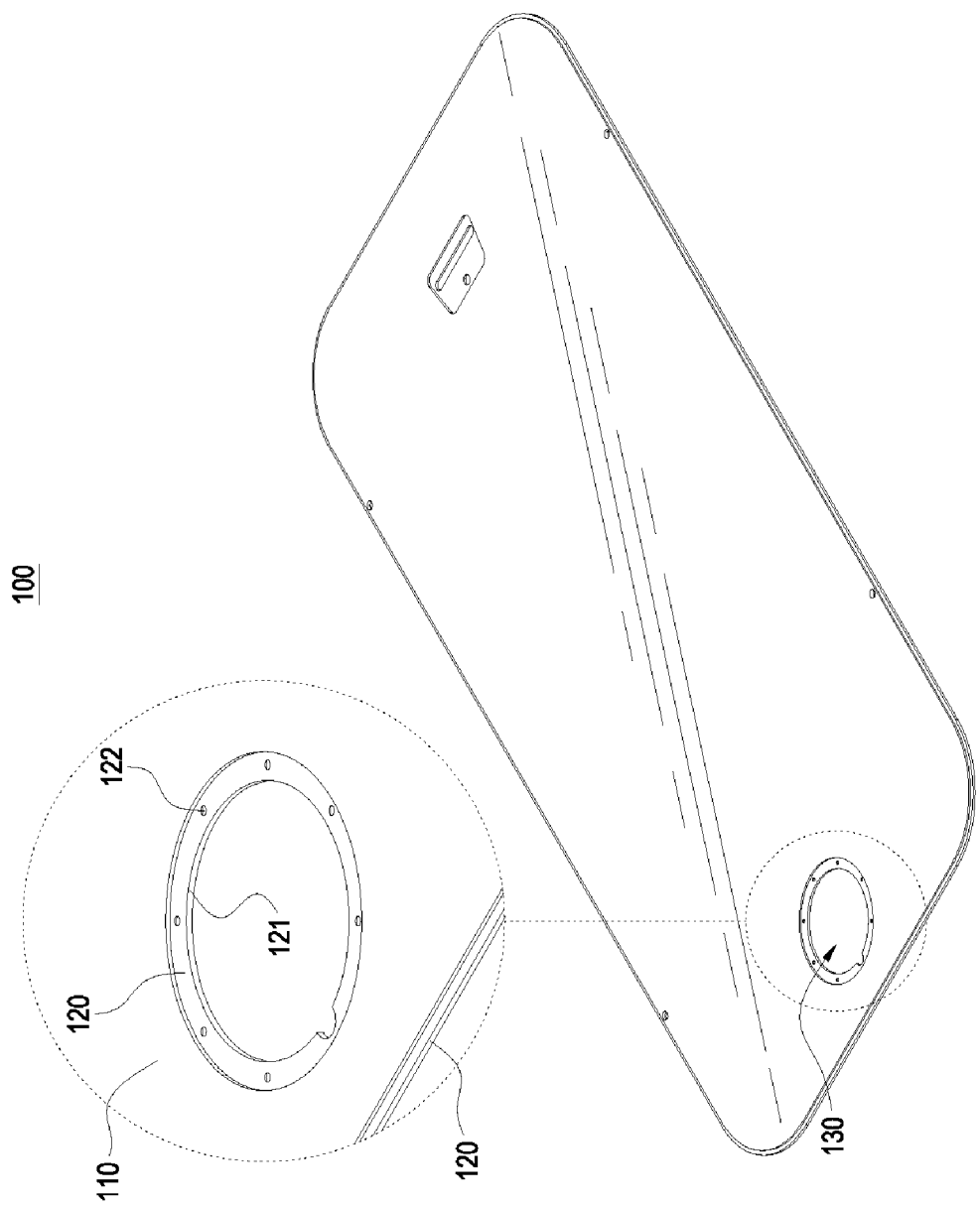
FIG. 2 is a schematic perspective view of a composite plate of the waterproof box structure of the present invention.
Figure 3:
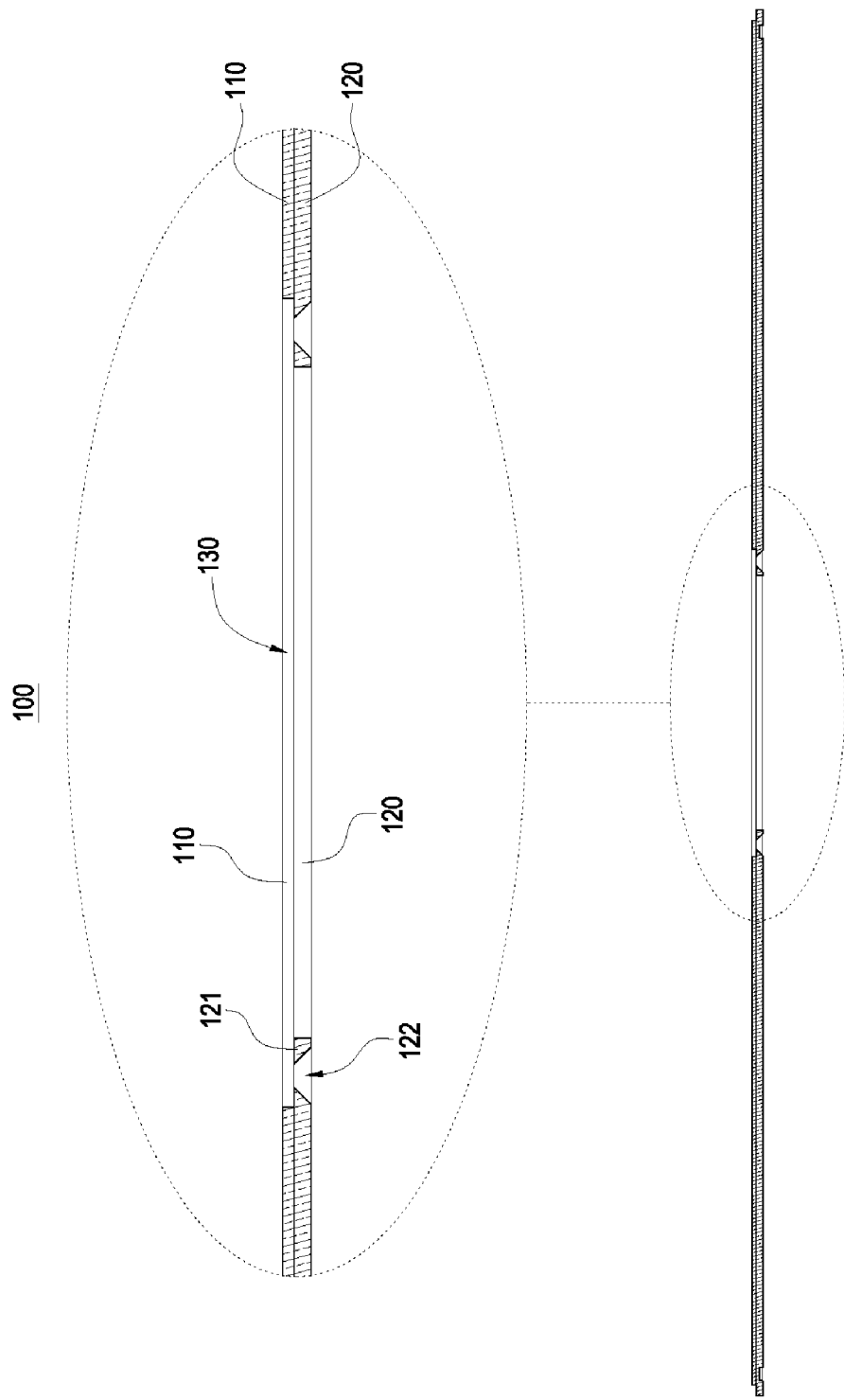
FIG. 3 is a cross-sectional view of the composite plate of the waterproof box structure of the present invention.

Referring to FIG. 2, there is shown a schematic perspective view of a composite plate of the waterproof box structure of the present invention. Referring to FIG. 3, there is shown a cross-sectional view of the composite plate of the waterproof box structure of the present invention. The composite plate 100 comprises a chemical curing layer 110 and a thermoplastic resin layer 120 adhered and coupled to each other. The composite plate 100 has a through hole 130. The through hole 130 penetrates the chemical curing layer 110 and the thermoplastic resin layer 120. The thermoplastic resin layer 120 extends from the inner rim of the through hole 130 and toward the center of the through hole 130 to form a flange 121. A plurality of taper holes 122 is penetratingly formed in the flange 121. The taper holes 122 each taper toward the chemical curing layer 110. Hence, the taper holes 122 each have a smaller diameter at the chemical curing layer 110 than at the thermoplastic resin layer 120.

Figure 4:
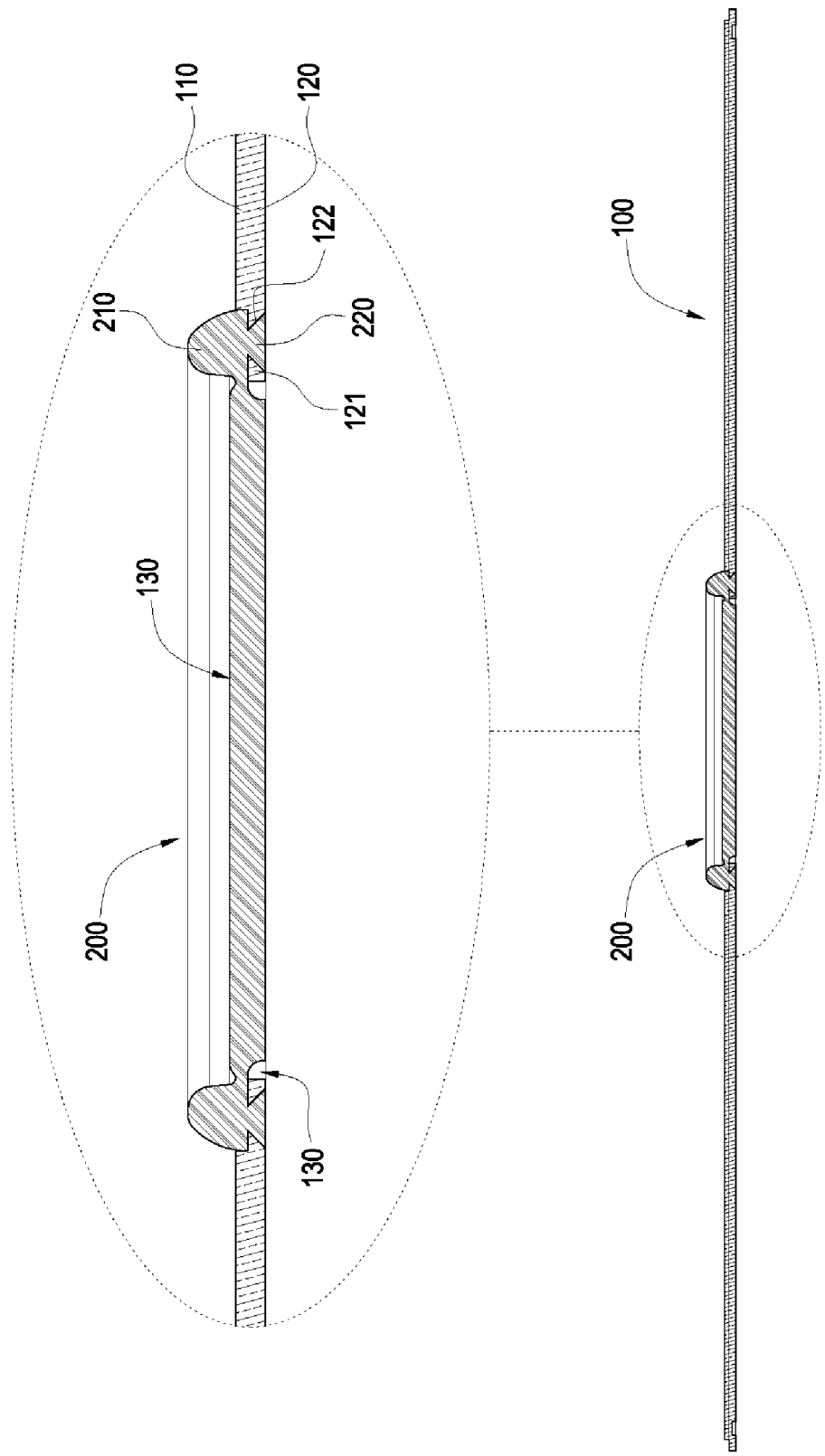
FIG. 4 is a cross-sectional view of a soft film of the waterproof box structure of the present invention.

Referring to FIG. 4, there is shown a cross-sectional view of a soft film of the waterproof box structure of the present invention. The soft film 200 is formed in the through hole 130 by insert molding and adapted to hide the through hole 130. The outer rim of the soft film 200 encloses the flange 121 and is coupled to the flange 121, such that the soft film 200 and the composite plate 100 are coupled together. A wall 210 is protrudingly formed on a surface of the soft film 200 to surround the surface. The wall 210 extends along the outer rim of the surface to assume an annular shape. A portion of the soft film 200 is surrounded by the wall 210, and the portion of the soft film 200 sags from the chemical curing layer 110 and toward the thermoplastic resin layer 120. Another surface of the soft film 200 extends to form a plurality of plug portions 220 protruding therefrom and corresponding in position to the taper holes 122. The plug portions 220 are each widening while extending outward and thus are inverted-cone-shaped. The plug portions 220 each match a corresponding one of the taper holes 122 in shape and position. The plug portions 220 each fill a corresponding one of the taper holes 122. The plug portions 220 of the soft film 200 are engaged with the taper holes 122 of the composite plate 100, respectively, such that the soft film 200 is firmly coupled to the composite plate 100.

Figure 5:
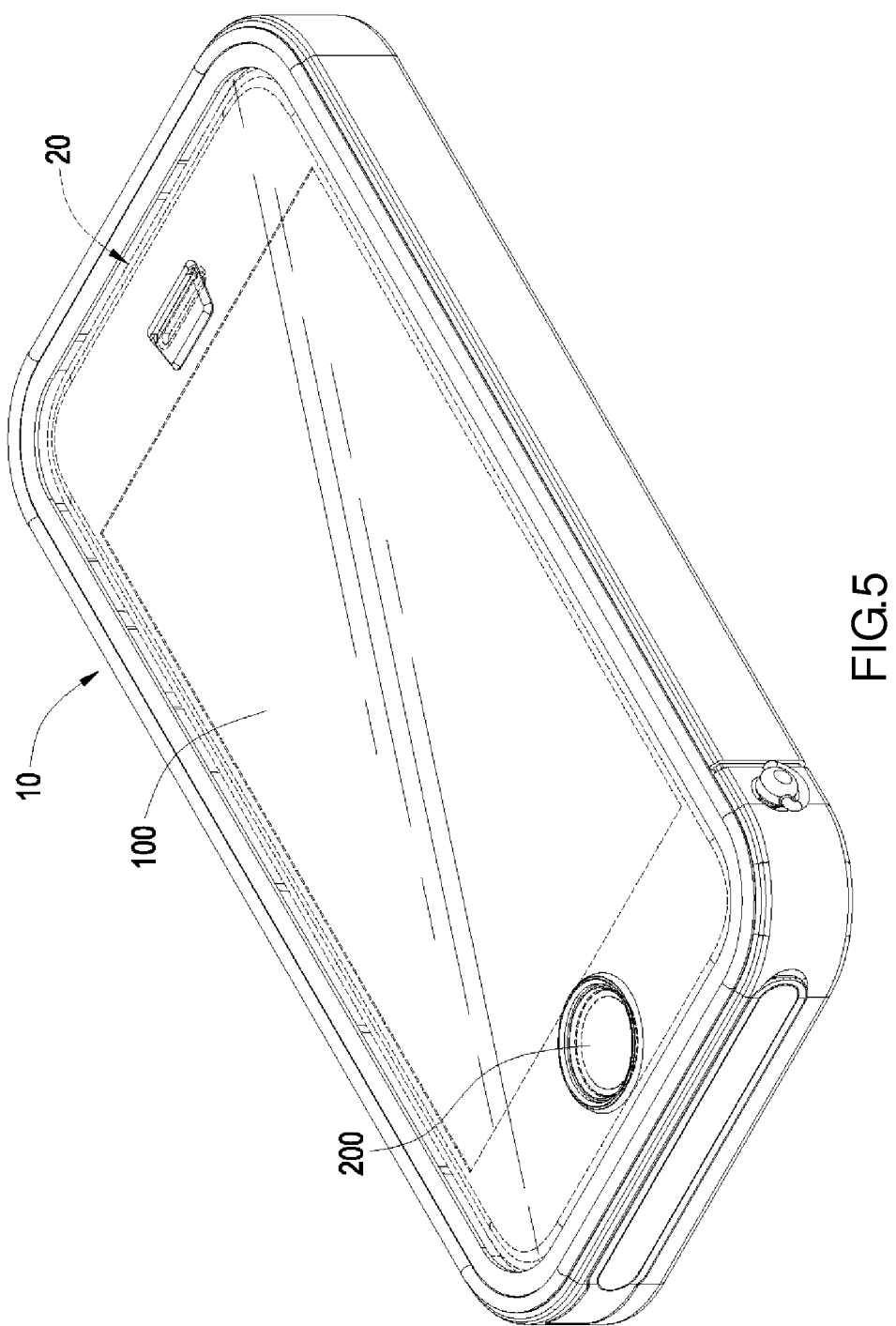
FIG. 5 is a schematic view of operation of the waterproof box structure of the present invention.
Figure 6:
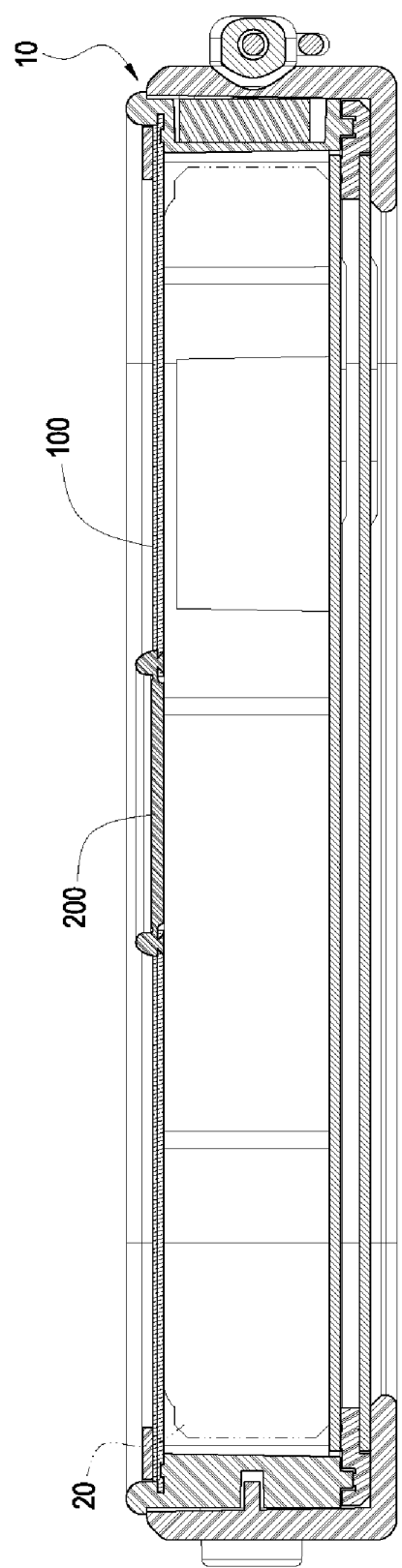
FIG. 6 is another schematic view of operation of the waterproof box structure of the present invention.

Referring to FIG. 5 and FIG. 6, there are shown schematic views of operation of the waterproof box structure of the present invention. The waterproof box structure of the present invention is applied to a waterproof box 10 shown in FIG. 5. Referring to FIG. 6, the waterproof box 10 encloses a mobile electronic device 20, such that the mobile electronic device 20 is confined to a hermetically sealed space defined by the waterproof box 10, and in consequence vapor cannot intrude into the mobile electronic device 20 to damage the mobile electronic device 20. Furthermore, the surface of the chemical curing layer 110 of the composite plate 100 is positioned outside the waterproof box 10 to resist abrasion, whereas the surface of the thermoplastic resin layer 120 is positioned inside the waterproof box 10. The sagged soft film 200 abuts against a button on the mobile electronic device 20. A user can press the soft film 200 and thereby press the button to operate the mobile electronic device 20.

The second embodiment of the present invention provides a waterproof box structure manufacturing method which comprises the steps described below.

Figure 7:
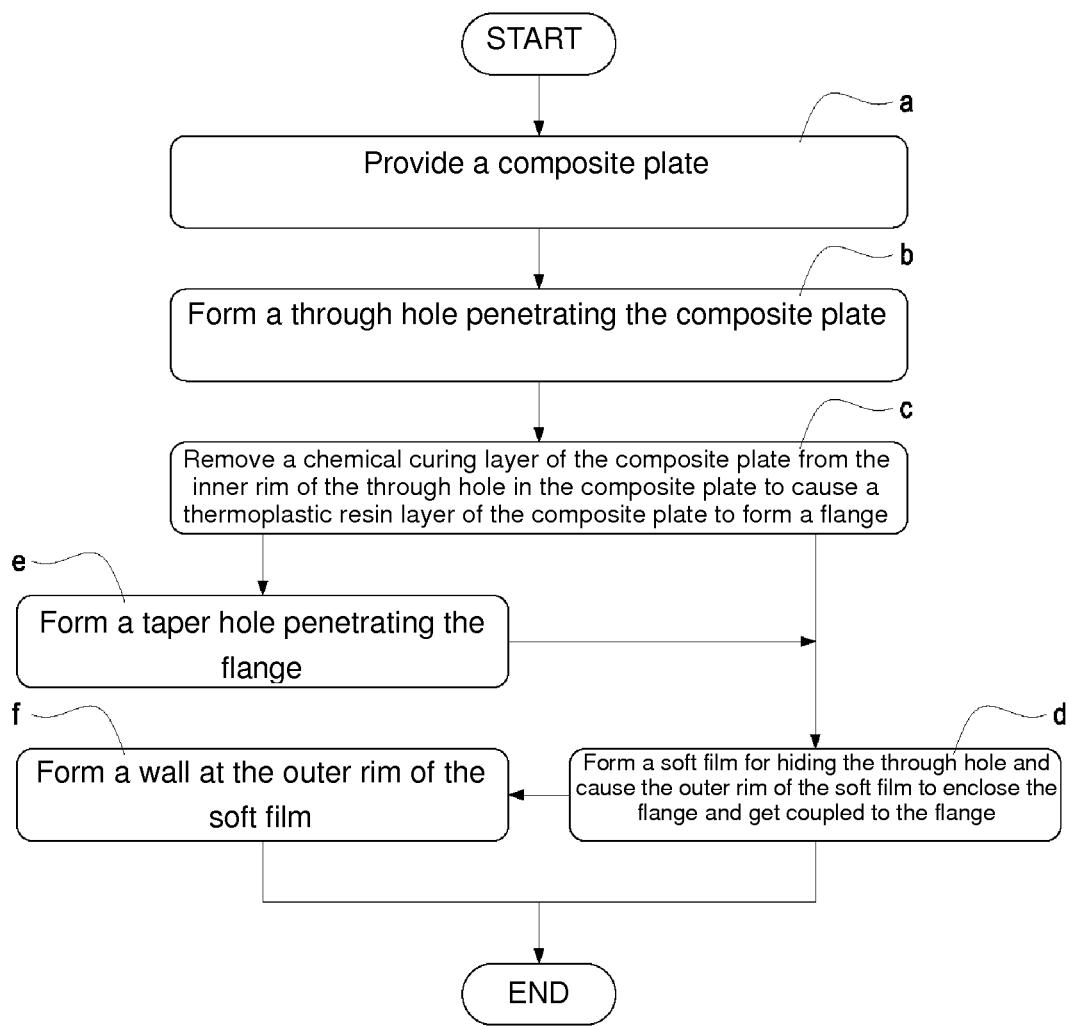
FIG. 7 is a flow chart of a waterproof box structure manufacturing method of the present invention.

Referring to FIG. 7, there is shown a flow chart of a waterproof box structure manufacturing method of the present invention. Referring to FIG. 7, step a of the waterproof box structure manufacturing method involves providing a composite plate 100 shown in FIG. 2, wherein the composite plate 100 comprises a chemical curing layer 110 and a thermoplastic resin layer 120 which are shown in FIG. 3, adhered, and coupled to each other.

Referring to FIG. 7, step b follows step a and involves forming a through hole 130 in the composite plate 100, wherein the through hole 130 is drilled to penetrate the chemical curing layer 110 and the thermoplastic resin layer 120 of the composite plate 100.

Referring to FIG. 7, step c follows step b and involves removing the chemical curing layer 110 from the inner rim of the through hole 130 by a milling process, such that the thermoplastic resin layer 120 is exposed from the inner rim of the through hole 130. The exposed portion of the thermoplastic resin layer 120 forms a flange 121 extending toward the center of the through hole 130.

Referring to FIG. 7, step e, which is optional, follows step c and involves performing a drilling process on the thermoplastic resin layer 120 of the composite plate 100 with a conical drilling bit, wherein the drilling process takes place at the flange 121. The conical drilling bit drills and penetrates the thermoplastic resin layer 120 to form a taper hole 122 in the flange 121. The taper hole 122 penetrates the flange 121 and tapers toward the chemical curing layer 110. In this embodiment, preferably, this step is repeatedly carried out so as to form a plurality of taper holes 122 in the flange 121.

In this embodiment, step d shown in FIG. 7 follows step e. However, if step e is not executed, step d will follow step c.

If step d follows step c, the composite plate 100 processed in the preceding step can be put in an injection molding die, such that a soft film 200 is formed in the through hole 130 by insert molding as depicted with FIG. 4 and adapted to hide the through hole 130. The outer rim of the soft film 200 encloses the flange 121 and is coupled to the flange 121. The central portion of the soft film 200 sags from the chemical curing layer 110 and toward the thermoplastic resin layer 120.

If step d follows step e, the details of step d will be substantially identical to those described in the preceding paragraph regarding step d, except that step d will further involve filling the taper holes 122 with a portion of the soft film 200 to form a plurality of plug portions 220. After the soft film 200 has taken shape, the plug portions 220 can hook and engage firmly with the taper holes 122, such that the soft film 200 and the composite plate 100 are coupled together firmly.

In this embodiment, step f shown in FIG. 7 is optional and occurs in synchrony with step d. In step f, the wall 210 surrounds the central portion of the soft film 200, after a wall 210 has been formed from the outer rim on a surface of the soft film 200 (shown in step d) by insert molding.

The present invention provides a waterproof box structure and a waterproof box structure manufacturing method. The chemical curing layer 110 of the composite plate 100 cannot be melted again by a heating process. Hence, the present invention is advantageously characterized in that a portion of the chemical curing layer 110 of the composite plate 100 is removed by milling, such that the thermoplastic resin layer 120 is exposed to form the flange 121. After a high-temperature material has been introduced into a die to form the soft film 200, the material comes into contact with the flange 121 to thereby soften the flange 121. In doing so, the flange 121 and the soft film 200 fuse together and thus are tightly coupled together, thereby ensuring the water-tightness at the junction of the composite plate 100 and the soft film 200. Furthermore, the waterproof box structure of the present invention is not only structurally simple but is also easy to manufacture.

The above preferred embodiments of the present invention are illustrative rather than restrictive of the scope of the claims of the present invention. Any other equivalent changes made to the preferred embodiments of the present invention in accordance with the spirit embodied therein must be interpreted to fall within the claims of the present invention.

What is claimed is:
1. A waterproof box structure, comprising:
   a composite plate comprising a chemical curing layer and a thermoplastic resin layer adhered to each other, the composite plate having a through hole, the through hole penetrating the chemical curing layer and the thermoplastic resin layer, wherein a diameter of the through hole in the thermoplastic resin layer is smaller than a diameter of the through hole in the chemical curing layer, such that a portion of the thermoplastic resin layer around the through hole is exposed by the chemical curing layer to form a flange; and
   a soft film covering the through hole, wherein an outer rim of the soft film covers the flange and is coupled to the flange.

2. The waterproof box structure of claim 1, further comprising a tapered hole formed through the flange adjacent to the through hole, wherein the tapered hole is filled with a portion of the soft film.

3. The waterproof box structure of claim 2, wherein a diameter of the tapered hole is larger on a side of the thermoplastic resin layer opposite to the chemical curing layer.

4. The waterproof box structure of claim 1, wherein a wall is protrudingly formed at the outer rim of the soft film to surround the soft film.

5. The waterproof box structure of claim 1, wherein the soft film is formed in the through hole by insert molding and coupled to the composite plate.

6. The waterproof box structure of claim 1, wherein the soft film sags in a direction from the chemical curing layer and toward the thermoplastic resin layer.

7. The waterproof box structure of claim 1, further comprising a plurality of tapered holes formed through the flange and surrounding the through hole, wherein the tapered holes are filled with a portion of the soft film.

8. The waterproof box structure of claim 7, wherein a diameter of each of the tapered holes is larger on a side of the thermoplastic resin layer opposite to the chemical curing layer.

9. A waterproof box structure manufacturing method, comprising the steps of:
   a. providing a composite plate, wherein the composite plate comprises a chemical curing layer and a thermoplastic resin layer adhered to each other;
   b. forming a through hole in the composite plate, wherein the through hole penetrates the chemical curing layer and the thermoplastic resin layer;
   c. removing a portion of the chemical curing layer from an inner rim of the through hole so as expose a portion of the thermoplastic resin layer around the through hole, wherein the exposed portion of the thermoplastic resin layer forms a flange; and
   d. forming a soft film covering the through hole such that an outer rim of the soft film covers the flange and is coupled to the flange.

10. The waterproof box structure manufacturing method of claim 9, further comprising a step of forming a tapered hole penetrating the flange adjacent to the through hole, wherein the tapered hole is filled with a portion of the soft film.

11. The waterproof box structure manufacturing method of claim 10, wherein a diameter of the tapered hole is larger on a side of the thermoplastic resin layer opposite to the chemical curing layer.

12. The waterproof box structure manufacturing method of claim 9, further comprising:
   e. forming a wall at the outer rim of the soft film.

13. The waterproof box structure manufacturing method of claim 12, wherein the wall surrounds the soft film.

14. The waterproof box structure manufacturing method of claim 9, wherein, in the step d, the soft film is formed in the through hole by insert molding.

15. The waterproof box structure manufacturing method of claim 9, wherein the soft film sags in a direction from the chemical curing layer and toward the thermoplastic resin layer.

16. The waterproof box structure manufacturing method of claim 9, further comprising a step of forming a plurality of tapered holes penetrating the flange and surrounding the through hole, wherein the tapered holes are filled with a portion of the soft film.

17. The waterproof box structure manufacturing method of claim 16, wherein a diameter of each of the tapered holes is larger on a side of the thermoplastic resin layer opposite to the chemical curing layer.

* * * * *